United States Patent [19]

Doane, Jr. et al.

[11] Patent Number: 5,499,444

[45] Date of Patent: Mar. 19, 1996

[54] METHOD OF MANUFACTURING A RIGID FLEX PRINTED CIRCUIT BOARD

[75] Inventors: Howard Doane, Jr., Amesbury, Mass.; Alfred F. Covino, Hudson; John M. Waite, Derry, both of N.H.

[73] Assignee: Coesen, Inc., Hudson, N.H.

[21] Appl. No.: 285,126

[22] Filed: Aug. 2, 1994

[51] Int. Cl.⁶ .............................. H05K 3/36; H05K 3/46
[52] U.S. Cl. ................... 29/830; 29/464; 29/760; 156/252; 174/254; 361/749; 361/804
[58] Field of Search ............................ 29/829, 830, 464, 29/760; 156/250, 252, 630, 632; 361/749, 784, 804; 174/254; 439/67

[56] References Cited

U.S. PATENT DOCUMENTS

| | | | |
|---|---|---|---|
| 3,325,691 | 7/1965 | Dahlgren et al. | 317/101 |
| 3,409,732 | 4/1966 | Dahlgren et al. | 174/68.5 |
| 3,683,105 | 8/1972 | Shamash et al. | 174/68.5 |
| 4,338,149 | 7/1982 | Quaschner | 156/248 |
| 4,353,954 | 10/1982 | Yamaoka et al. | 428/216 |
| 4,626,462 | 12/1986 | Kober et al. | 428/137 |
| 4,634,631 | 1/1987 | Gazit et al. | 428/421 |
| 4,687,695 | 8/1987 | Hamby | 428/192 |
| 4,715,928 | 12/1987 | Hamby | 156/630 |
| 4,756,940 | 7/1988 | Payne et al. | 428/78 |
| 4,800,461 | 1/1989 | Dixon et al. | 361/398 |
| 4,872,934 | 10/1989 | Kameda | 29/830 X |
| 4,882,216 | 11/1989 | Takimoto et al. | 428/209 |
| 4,882,245 | 11/1989 | Gelorme et al. | 430/14 |
| 4,897,301 | 1/1990 | Uno et al. | 428/209 |
| 4,931,134 | 6/1990 | Hatkevitz et al. | 156/630 |
| 4,961,806 | 10/1990 | Gerrie et al. | 156/252 |
| 5,004,639 | 4/1991 | Desai | 428/138 |
| 5,047,896 | 9/1991 | Zust | 29/830 X |
| 5,084,124 | 1/1992 | Taniguchi | 156/315 |
| 5,095,628 | 3/1992 | McKenney et al. | 29/846 |
| 5,100,492 | 3/1992 | Kober et al. | 156/250 |
| 5,121,297 | 6/1992 | Haas | 361/398 |
| 5,144,742 | 9/1992 | Lucas et al. | 29/830 |
| 5,175,047 | 12/1992 | McKenney et al. | 428/209 |
| 5,178,318 | 1/1993 | Edwin et al. | 228/180.2 |
| 5,192,619 | 3/1993 | Konotsune et al. | 428/458 |
| 5,206,463 | 4/1993 | DeMaso et al. | 174/254 |
| 5,219,640 | 6/1993 | Gazit et al. | 428/209 |
| 5,229,192 | 7/1993 | Kober et al. | 428/209 |
| 5,260,130 | 11/1993 | Sakaguchi et al. | 428/355 |
| 5,262,594 | 11/1993 | Edwin et al. | 174/254 |
| 5,288,542 | 2/1994 | Cibulsky et al. | 428/209 |
| 5,317,292 | 5/1994 | Leeb | 29/830 X |

FOREIGN PATENT DOCUMENTS 3240754  5/1983  Germany ............................. 29/830

*Primary Examiner*—S. Thomas Hughes
*Attorney, Agent, or Firm*—Lahive & Cockfield

[57] ABSTRACT

Rigid flex printed circuit boards are formed with great efficiency and high yield in an assembly process wherein each circuit layer is punched in peripheral regions with alignment slots along two orthogonal radii and all layers are assembled without any acrylic bonding in a single hot press operation. A central flex layer spans a window defined in the rigid boards, and is covered with an insulating layer that overshoots the window and underlaps a rigid layer. At least the first rigid layer extends inwardly past the edge of the window, and provides a cantilevered edge support ribbon at the flex region boundary. Preferably the rigid and flex layers are all formed with a glass/epoxy material.

7 Claims, 3 Drawing Sheets

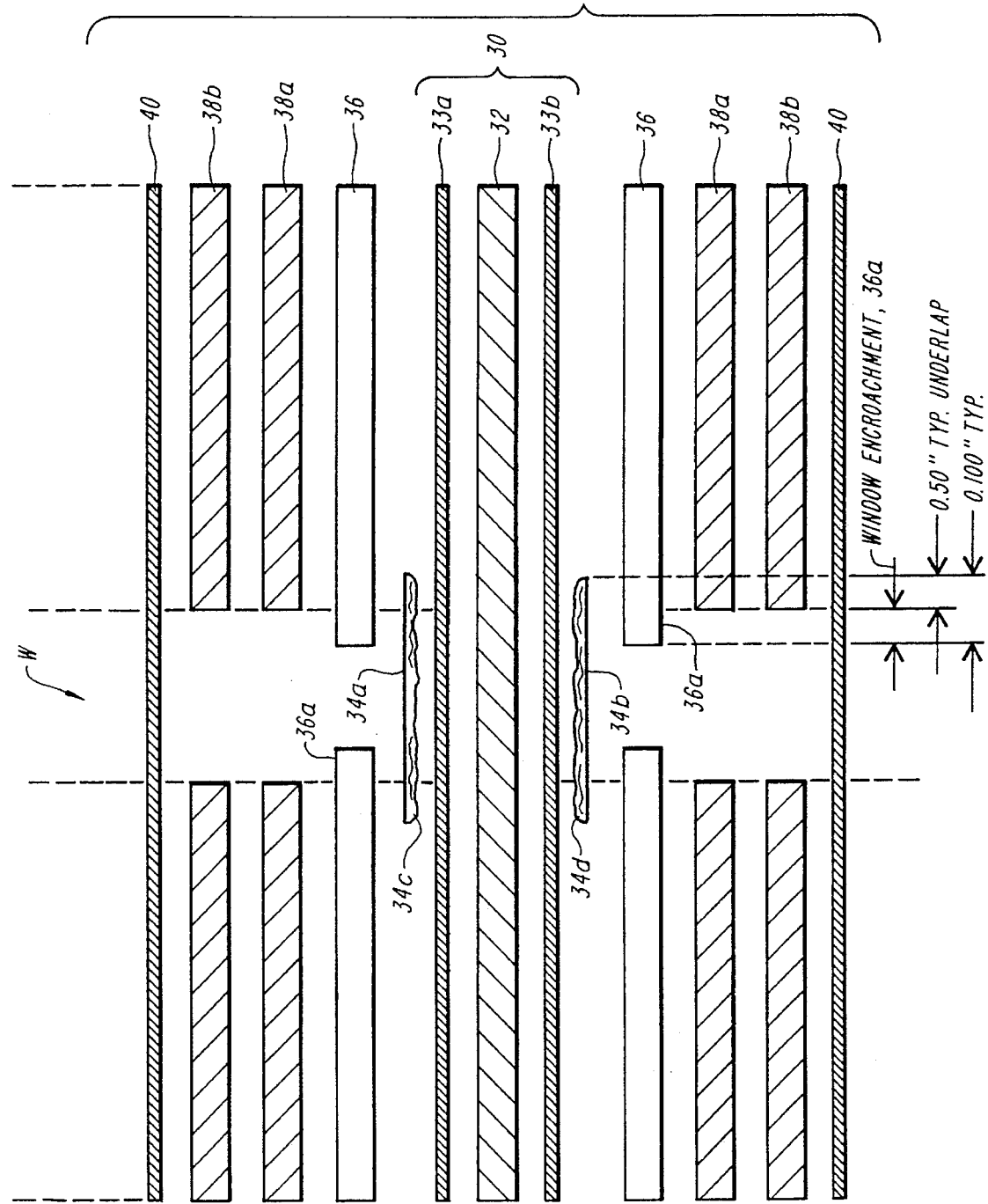

METHOD OF MANUFACTURING A RIGID FLEX PRINTED CIRCUIT BOARD

The present invention relates to multilayer rigid flex printed circuit boards and to methods of fabricating such boards.

By rigid flex is understood to mean that the board has at least one portion and preferably at least two, which are rigid and consist of two or more layers on which conductive lines are laid out to connect to circuit elements and/or each other, and that the board has at least one portion which is flexible extending from or interconnecting the rigid portions.

Over the last several decades multilayer rigid flex printed circuit boards have been evolving from relatively simple constructions to constructions involving an ever greater number of layers and requiring higher degrees of flexibility and environmental resistance or longevity, and greater circuit density. An early example of the prior art is shown in U.S. Pat. No. 3,409,732 of Teledyne Industries, Inc. In a typical rigid flex printed circuit board construction, a flexible printed circuit portion, essentially amounting to customized cabling, extends from one or more edges around the periphery of the rigid section or sections. The rigid portions are typically used for mounting electronic components and for interconnecting different circuit layers of the rigid board to form the desired connection of subcircuits within the assembly, and also used for mounting connectors and hardware. The flex portion on the other hand serves to connect the various rigid portions while allowing rigid portions to be located in a hardware piece of equipment in different planes or at different angular orientations with respect to each other. As the density of electronic circuitry has become greater over the years, more complex multilayer rigid flex circuit boards have evolved, with boards now having a dozen or more patterned conductive circuit layers.

For making such boards, a number of standardized materials have come into use in the field, including among other things, insulating film material such as the polyimide filme sold under the trademark KAPTON acrylic adhesive used for bonding the film to portions of a board, special copper clad KAPTON film or epoxy glass sheets used for forming circuit layers, where the copper is typically a rolled beryllium copper or other rolled annealed high tensile strength metal, and a number of materials for making rigid boards or laminating them together to form multilayer boards. The principal materials of this latter type are prepreg, a pre-impregnated fiberglass epoxy sheet spacer or bonding material, and various polyimide or epoxy/glass copper-clad laminates.

The fabrication of multilayer boards with such materials has lead to several persistent problems. First, in common with all printed circuit board fabrication, alignment of circuitry at different layers in the board is critical, and provisions must be made to prevent sliding of any layers in different planes with respect to other planes by more than a tolerance of a few thousandths of an inch. Maintaining registration of the flexible portion has also been a serious problem, since the hard board must be cured or laminated by a heat-press process that is likely to cause interlayer slippage as well as thermal dimensional changes. These two problems in the prior art have generally entailed a number of separate and successive lamination steps to build up a board with all components in registry, and also assembling the different layers in a press using a great many pins through the layers distributed at a number of critical points in order to maintain an acceptable level of registration during the sequence of lamination processes. Other problems are encountered due to the thermal expansion of the typically used insulator materials such as acrylic adhesive and polyimide film utilized in the construction of the rigid flex boards. Thus, failures occur when the board is subjected to elevated temperatures in thermal stress testing, hot oil solder reflow, and the like. The relative rate of thermal expansion of the acrylic adhesive used for bonding flexible polyimide sheets is about thirty percent, of KAPTON sheets about ten percent, and of copper about four percent. When hot oil is used to reflow solder plated on the rigid printed circuit board, temperatures on the order of 450°–500 degrees F. cause expansion, for example, of the acrylic adhesive used to bond layers of KAPTON film to copper layers in the multilayer rigid sections. As temperatures increase, the board, which is unrestrained, grows much faster in the thickness, or Z direction, than "copper barrels" formed in the plated through holes in the multilayer rigid board section. The copper barrels stretch as the acrylic adhesive and KAPTON layers expand, sometimes fracturing the copper. Repeated cycles tend to break many of the plated copper barrels found in the holes in the rigid board sections.

If less acrylic adhesive is used to limit expansion, the internal stresses developed during lamination procedures cause voids or delaminations in the final board, which are also unacceptable. Since these deficiencies do not become apparent until the final stages of construction, costly scrapping of nearly completed boards is required.

Another difficulty with the use of dielectric films such as KAPTON film in the rigid board area is their absorption of excessive moisture, on the order of up to 3 percent by weight of water. Absorbed moisture in the circuitry, with no means of escape, may cause unacceptable delamination in the rigid board area when it volatizes during fabrication or subsequent high temperature operation. This effect may be more destructive than the simple mismatch of thermal coefficients. To remove the moisture from the KAPTON film and acrylic layers, the board must be baked at temperatures on the order of 110° C. for many hours—for example, 12, 24 or even 48 hours—an expensive process.

Thus, multilayer rigid flex boards including insulator materials such as acrylic adhesive and KAPTON will always place Z-axis stress on plated through holes. The coefficient of thermal expansion of the acrylic adhesive and the presence of water are dominant influences. Because of the amount of acrylic required in many multilayer rigid flex applications, all plated through holes will be stressed, with many of these cracking, making these boards unusable.

Another, although lesser consideration, is the use of insulating layers such as glass layers in the flex cables. While considerable bending is possible with a glass layer in the laminated flexible areas, some applications require the cables to be flexed repeatedly through large angles resulting in fractures and other problems: thus, elimination of a glass layer from the flex cable may, in certain circumstances, be desirable. However, to achieve flexibility by that route involves a tradeoff in strength.

Each of the foregoing problems has been addressed in the prior art to some extent, as shown, for example, in U.S. Pat. No. 4,800,461; U.S. Pat. No. 5,144,742; and U.S. Pat. No. 5,004,639. Approaches to addressing one or more of the foregoing problems involve such construction techniques as adding pads in non functional layers of the plated through holes, utilizing a curable liquid dielectric for certain layers or portions of layers, using temporary sheet patches of filler material surrounding flex regions during a heat pressing assembly stage to maintain alignment; adding glass fiber reinforcement to the flex layer for strengthening; and a number of other changes or additions to the manufacturing process. However, each of these solutions entails additional steps to address any one problem, and may have adverse consequences on another apparently unrelated problem. Thus, for example, the switch to acrylic cements and a polyimide flexible film has been largely responsible for moisture absorption and failure of plated through holes in multilayer boards at high temperatures. Reducing the size of polyimide/acrylic components to limit thermal stress introduces boundary problems where flexible and rigid elements are patched together. Furthermore, many of these improvements require more detailed manufacturing steps that can be costly as well as time consuming.

Thus, taking a larger view, a problem to be noted in the manufacture of rigid flex printed circuit boards is the relative complexity and cost of the manufacturing processes required to successfully integrate flexible and rigid elements in a single circuit board assembly.

Accordingly, it would be desirable to have a simpler, more efficient or cost effective manufacturing process that nonetheless addresses the foregoing problems in the art.

SUMMARY OF THE INVENTION

A rigid flex printed circuit board is assembled in accordance with the present invention by providing a flex layer in a defined region which is covered with flexible insulation extending outwardly of the boundary of the flex portion, while a hardened but very thin layer extends inwardly of the boundary over the flex portion thus providing a cantilevered support lip at the boundary. Multiple spacer and circuit layers are assembled together in a stack with the flexible first part. Before assembly, each circuit layer is punched with sets of slots that each allow motion along only one of two orthogonal axes, and all the punched layers are assembled in a single press curing operation in which process-induced motions and realignment are constrained to occur with a small magnitude that varies with the radial position along an alignment rosette centered on the board. A top or final cover layer extends over both the flexible and rigid regions to further assure uniform alignment at all levels during pressure assembly. Preferably spacer layers are formed of low-flow or no-flow prepreg, while the intermediate circuit layers are formed of a metalized glass epoxy hard circuit board. Heat pressing is performed only once during final assembly of all circuit layers into a unitary board.

BRIEF DESCRIPTION OF THE DRAWINGS

These and other features of the invention will be understood with reference to the figures below and the description thereof, wherein:

FIG. 2 shows a schematic representation of vertical section through the board of FIG. 1 taken in a direction parallel to its longitudinal axis;

DETAILED DESCRIPTION

Figure 1:
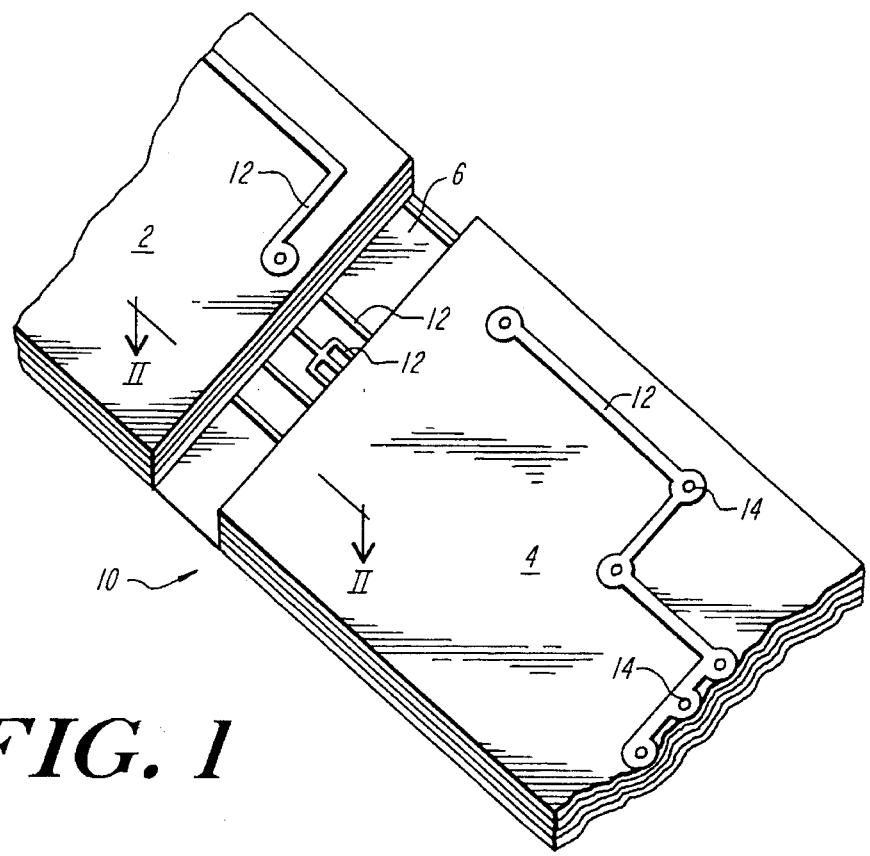
FIG. 1 shows a top perspective view of a rigid flex printed circuit board in accordance with the present invention.

FIG. 1 shows a top perspective view of a rigid flex printed circuit board 10 in accordance with the present invention, in its completed state. Board 10 comprises first and second rigid board portions 2, 4 and a flexible portion 6 interconnecting the rigid portions. The flexible portion 6 is a thin sheet, which is preferably but not necessarily vertically centered in its juncture with the adjacent rigid portions 2, 4. Each portion carries conductive leads 12, and the rigid portions have plated through holes or other holes 14 which serve to form interlayer through-plated circuit connections, or to receive surface mounted hardware or circuit elements. The rigid portions 2, 4 have generally a greater number of layers than the flexible portion, as discussed further below. While not shown in this Figure, board 10 during fabrication has a number of slots 16a, . . . 16d near its ends or edges, the function of which will first be discussed.

In accordance with a principal aspect of the present invention, a rigid flex board is assembled from a number of thinner component layers, each of which has been pre-punched with alignment slots 16a, 16b . . . , and formed with a window 26 corresponding to the position of a flex portion 6.

Figure 4:
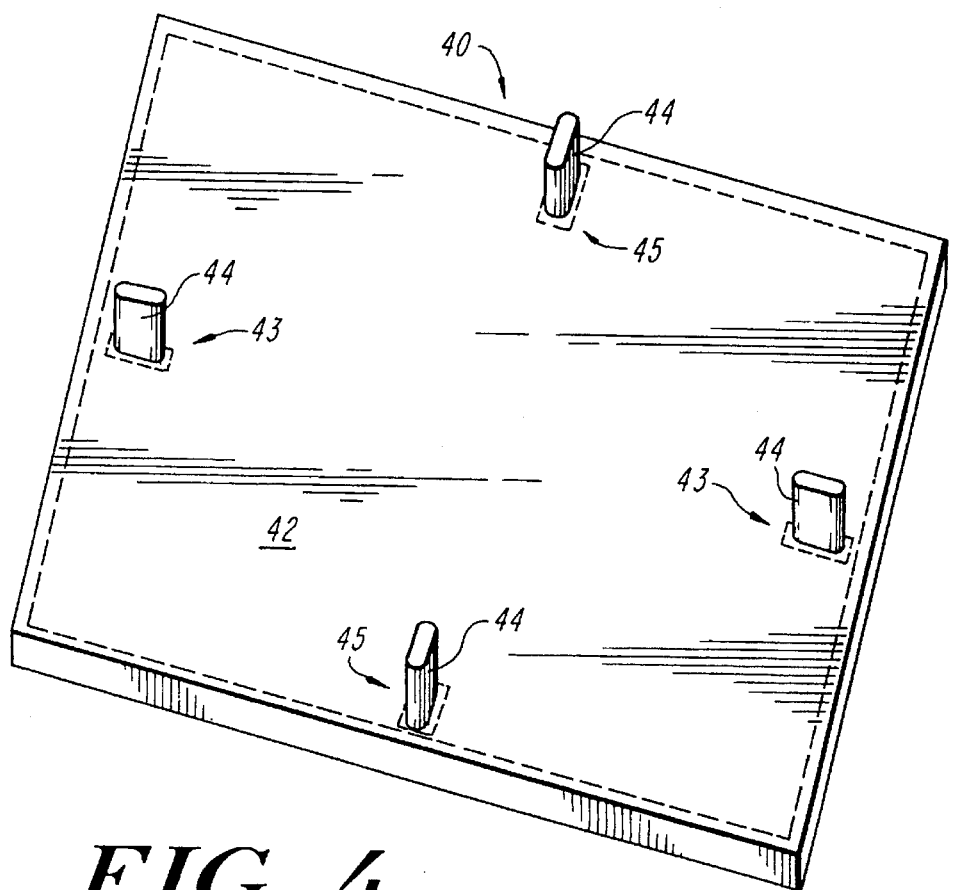
FIG. 4 schematically depicts an alignment table for assembly of the rigid flex board of FIG. 1.

Skipping ahead briefly to FIG. 4, there is shown a lamination plate or platen 40 of the type generally used for assembly of multilayer rigid circuit boards. Platen 40 consists of a flat bed 42 having first and second pairs of machined slots 43, 45, each configured with alignment dowel pegs 44 at the four discrete positions defined by the slots near midpoints of the edges of a rectangular board (shown in phantom). A corresponding four-slot punch press commonly used in the rigid printed circuit board (PCB) industry has four adjustably positioned punch dies configured to punch slots in single sheets of circuit board material at the desired locations so that a board so punched will fit over the pegs. In practice, the punch dies are adjustably configured to continuously adjust their position along each of two orthogonal lines on which a peg may be positioned, as is well known in the art of rigid board fabrication. In general, a special pair of top and bottom lamination plates 40 are made up for each size board which is to be fabricated with the alignment posts 44 positioned about three-eighths of an inch in from the edge. Typically, the plates are made to accommodate boards between about nine by twelve inches, to about eighteen by twenty-four inches. A suitable four-slot PCB punch is that sold under the ACCULINE trademark, by the Multiline Company of Farmingdale, N.Y. As described above, its slot punches may be adjustably positioned to accommodate any size board.

Figure 4A:
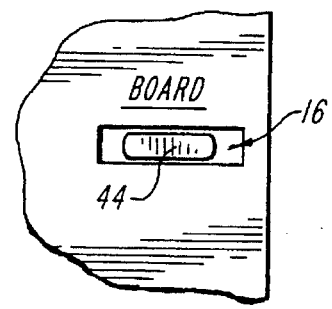
FIG. 4a shows details of sheet alignment.

FIG. 4A shows a detail of the alignment slots 16 of the intermediate boards during assembly. The dowels or alignment pins 44 of the lamination plate 40 fit into the slots 16 such that a small amount of motion is possible along the long axis of the slot, while no motion can occur in a transverse direction. Each slot is located along the lobe of a rosette, i.e. they are symmetrically spaced and oriented "radially" in toward the center of the board, and thus allows motion along the direction of thermal expansion or material shrinkage of an unconstrained board, so that all boards selfalign during the lamination step. It is only necessary that the earlier window routing and circuit lithography steps have been carried out using the four slot locations for basic registration of the circuit patterns or openings formed on each board.

Figure 3:
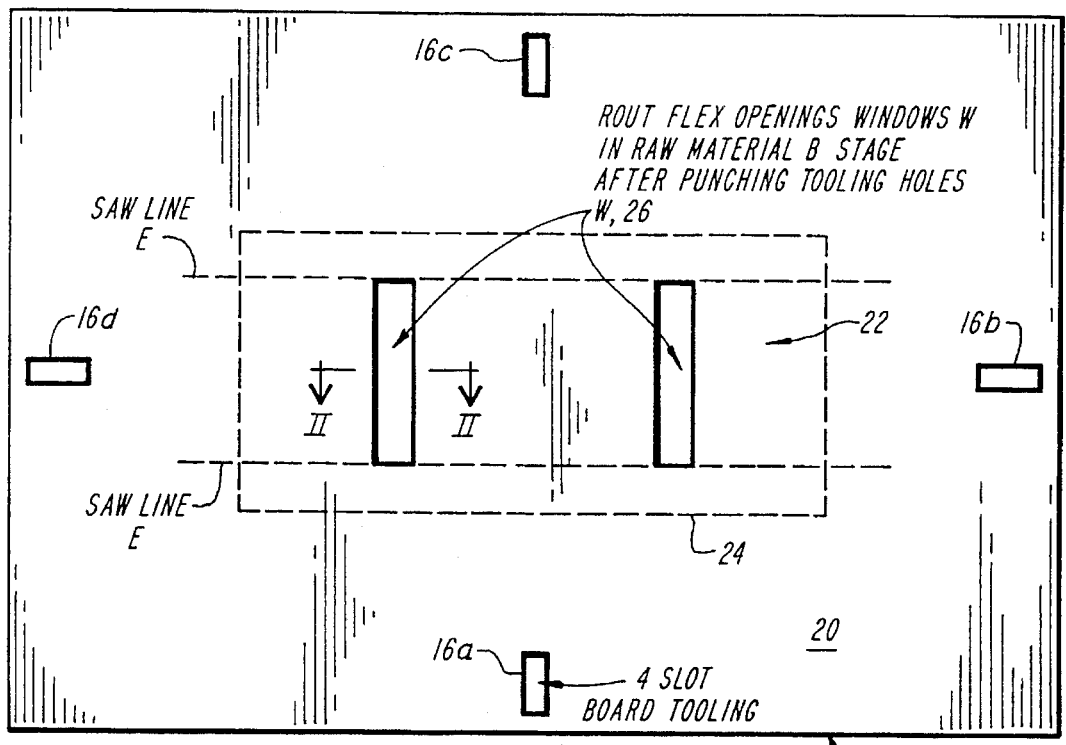
FIG. 3 shows an aperture configuration of a process panel for assembly into the rigid flex board of FIG. 1.

In accordance with the present invention, a rigid flex board is assembled as a stack containing a plurality of patterned circuit boards and intermediate layers of prepreg spacer material, all of which have been punched with alignment holes to fit the lamination plate 40. FIG. 3 shows a rigid PCB layer 20 as used in the fabrication of a rigid flex board in accordance with this aspect of the present invention.

The preferred material for manufacture of rigid flex boards of the present invention is the commonly used glass/epoxy heat curable material which is available as sheet stock liar use as bonding or spacer layers and also available with one or both surfaces covered with a rolled annealed copper foil, that may be patterned by conventional photolithography or masking, and etching techniques. This material may be patterned and built up in successive circuit, bonding and spacing layers. A single layer of this material, when hardened, is stiff but flexible, while multi-layer portions become quite rigid. In accordance with a preferred embodiment of the invention, this glass epoxy is used for both the flexible and the rigid portions of the board.

In general, this material is hardened to various degrees during processing, with the raw uncured or "A stage" material being quite flexible and tacky. Circuit layers are generally semi-cured to a "B stage" to provide a higher degree of dimensional stability and less limp handling characteristics during photopatterning. In this B stage material, the epoxy is dry and yet not fully cross-linked. Final "C stage" hardness is attained by assembling with heat and pressure (e.g. 350° F. and 300–350 PSI for several hours). As will be apparent below, the preferred assembly process of the present invention utilizes C stage functional layers, i.e., copper clad circuit layers for most manufacturing steps, while only a single heat lamination step is required for the final assembly. In particular, different layers are stacked and aligned only once, rather than cumulatively building up a board with many lamination steps.

Returning now to FIG. 3, there is shown a top elevational view of a process panel 20 which is to form one layer of the final flex circuit. Alignment slots 16a, 16b, 16c, 16d are shown at the midpoints of the sides, with each slot elongated along an axis directed at the center of the board, and a central region 22 is indicated by a phantom boundary line 24 to delineate the area in which active circuit patterning is to be formed. The edges of the board, while important to the manufacturing steps, are understood to be a generally inert boundary region which after manufacture is of no functional value, and which is to be sawn off along border 24 after final assembly. Thus, while these edges, and slots 16a, 16b, 16c, 16d have been illustrated in the Figure, it will be understood that such illustration is for explanatory purposes for the process of manufacture only, and the finished board will be tailored to remove these regions at its edge.

Within the central region 22, one or more windows W (denoted by 26) have been formed extending substantially across the width of the region 22. These windows may be formed by an operation such as routing of B or C stage material, and the material may be stacked to rout openings 26 simultaneously in many such layers at once. In practice, the openings 26 are routed in precise alignment with respect to the slots 16a . . . 16d, and are located precisely in the region of the finished bond which is to be flexible. Routing of windows 26 thus defines the regions where no additional layers of prepreg material will be stacked, and thus defines the region of the finished board which remains flexible.

FIG. 2 illustrates a basic embodiment of this construction, showing in schematic relation, the layers of a rigid flex board having four conductive layers, viewed in a vertical section directed along the length of the board.

A central layer 30 is formed of a sheet of epoxy/glass material 32 with top and bottom copper foil layers 33a, 33b which have been appropriately patterned into the desired conductive circuit patterns, with the central layer 30 extending over the full area of the board. Layer 30 has been cured to C stage hardness and is punched with slots 16a . . . 16d at its edge as described above before circuit patterning. However, it has no window like the window of the other layers, precisely because it is to constitute the flexible portion 6 of the finished board extending across the window W (FIGS. 1, 3). By using a glass/epoxy layer for the central flexible portion instead of some form of polyimide or other material, applicant achieves an all-glass board construction that is free of the major problem—z-axis thermal stresses—of the conventional polyimide-glass constructions.

Continuing with a description of the layer structure of the rigid flex board, on top of the copper layer 33a is a cover of insulating material 34a which extends slightly outside the window 26 in a further narrow strip or band 34c of approximately 1.2 to 2.5 millimeters width, with a similar insulator 34b with oversize peripheral band 34d covering the opposite conductive circuit layer 33b. Insulating material 34a, 34b may be an adhesively bonded plastic film or a coated-on film, such as a conformal cover coat, as is known in the art, and preferably has a thickness in the range of 0.01–0.03 millimeters. Layers 34a, 34b are electrically insulating, relatively impermeable, and preferably have a Young's modulus when fully cured, which is less than that of layer 32 to form an elastic cover that allows a degree of compliance when the layer 30 flexes.

Suitable material for coating on the insulating cover patches 34a, 34b is a solder mask such as the UV-curable flexible solder resist SD2460/201 of Lackwerke Peters Gmbh., or the heat curable coating preparation trademarked IMAGECURE AQUAFLEX $H_2O$-600 sold by ASI-Coates, both of which may be applied in a screening operation. This cover material is then cured before assembly with the next layers described below.

Over the insulating layer 34a or 34b is a first apertured layer 36 which is preferably an apertured sheet of prepreg cover coat material. This layer extends approximately one to two millimeters inwardly of the window, forming a cantilevered inner band 36a extending in from the edge over the flex cover 33a, 33b and which reinforces the edge region of the flexible window area. Thus, each of the first two layers over the flex conductors 33a, 33b, overshoots the window, in opposite directions, creating a peripheral anti-cracking support much like a window gasket or a flexible flange, and forming a transition between the rigid portion 2, 4 and the flexible region 6 (FIG. 1).

Thereafter, above these first two layers, successive layers 38a, 38b of prepreg spacer material, and conductive copper sheet 40 for forming a circuit layer are placed, with the hardenable prepreg precisely aligned with the window W and the sheet 40 extending uniformly over the whole surface. The entire stack of layers as described is assembled on an alignment plate (FIG. 4), a mating top lamination plate is placed over the stack and it is pressed between plates at 300–350 psi pressure and a temperature of 350° F. for several hours to form a hard unitary board structure. The outer copper layers 40 are then patterned and etched, both to form the desired circuit features in this layer, and to remove the portion overlying the window. This forms a curable stack in which the multiple-layer portions have become rigid boards, while the central layers 32–34 are protected and reinforced, and remain free to flex in the window region. Unlike most conventional board fabrication, the layers 38a, 38b . . . are preferably formed with low-flow or no-flow prepreg material, such as is commercially marketed in 1080 and 106 weaves. This assures full bonding and uniform layer thickness at the window boundaries, so that the support ribbon is wellformed and functions effectively.

As noted above each of these layers is punched with alignment slots and then routed as described in connection with FIG. 3, so that the illustrated edge alignment is achieved at the window simply by stacking the punched boards or spacers on the lamination plate 40 (FIG. 4), without the elaborate drilling and pinning required in prior art processes.

FIG. 2 is a cross-sectional view of a four-layer rigid flex board, with the outer (top and bottom) layers being conductive foil, that may be patterned as in a conventional process, and the portion of the copper layer overlying the window can be removed during etching.

For making a board with six—, eight or more circuit layers, then rather than building up the board entirely of separate layers of foil and prepreg, each intermediate circuit layer assembly, made up of a prepreg and foil pair or a foil/prepreg/foil triplet, is pre-hardened to a C stage hardness and punched with alignment slots 16a . . . 16d, and the foil layer is patterned before it is assembled into the stack. In this case, however, once the intermediate board layer is punched with its four alignment slots, the window W is milled in the board (or in a stack of boards simultaneously). Assembly of these layers over layers 32–36 then proceeds as described above, using intermediate layers 38a of slotted, windowed prepreg and a single laminating operation.

After completion of the lamination steps, various conventional operations for drilling through holes and plating the through hole circuit connections are performed, and the edges of the board are sawn off, at positions indicated generally by dotted lines "E" in FIG. 3, leaving the rigid board portions free to move on either side of the window W.

This completes a description of one illustrative embodiment of the invention, wherein a multi-layer rigid flex board is formed by lamination of sheets pre-punched with peripheral radial alignment slots, such that the flex region undergoes a single hot press lamination which occurs during a final assembly operation. The process can be implemented without any acrylic or polyimide materials, and involves almost entirely fabrication steps common to rigid multilayer board making, in which the complexities of rigid-flex multiple lamination processes and its alignment problems are entirely avoided. Only the steps of forming a flex cover and routing a window region are added to the usual manufacturing steps for a rigid board, so that the manufacturing costs are not significantly different than the costs of making rigid boards.

It will be apparent that various substitutions and variations of the material used or the steps of manufacturing are possible, and these variations and substitutions are considered to be within the scope of the invention, as set forth in the claims appended hereto.

What is claimed is:

1. A method of forming a rigid flex printed circuit board, such method comprising the steps of providing a first flexible circuit layer including a flexible substrate and a flexible metal film patterned into conductive leads providing a plurality of rigid circuit layers, each rigid circuit layer including an aperture the apertures together forming a window region about said flexible circuit layer each of said flexible and said plurality of rigid circuit layers having slots therein along two orthogonal radii, wherein conductive lines on said layers are formed in registry with the slots, and subsequently, in a single lamination step assembling all of the foregoing layers together in a stack with an insulating layer adjacent the first flexible circuit layer extending only slightly beyond said window region to insulate and support the first flexible circuit layer, and with a first stiffening layer above said insulating layer and extending only slightly into said window region to provide a reinforcing lip about edges of said flexible layer, the step of assembling including stacking the layers on a plate with alignment pegs extending only slightly through said slots whereby circuit conductors of each layer are positioned in registration with each other, and curing the stack to form a unitary circuit board which is rigid outside said window region.

2. The method of claim 1, wherein the step of assembling layers into a stack includes assembling with spacer layers, and each spacer layer includes matching slots therein along said orthogonal radii.

3. The method of claim 1, wherein the step of assembling includes stacking the layers on alignment pegs extending through the slots and press laminating the layers into a rigid board, wherein each alignment peg is shaped to prevent motion perpendicular to a slot axis, the slots being spaced to allow only a uniform distribution of dimensional change without global slippage during press lamination of said stacked layers.

4. The method of claim 1, wherein the step of providing a plurality of rigid circuit layers includes routing a window in each rigid circuit layer.

5. A method of forming a rigid flex circuit board, such method comprising forming rigid circuit layers and a flex circuit layer, each layer having a center and a plurality of radially oriented slots remote from its center forming a window in each of the rigid circuit layers at a fixed position to expose the flex circuit layer, and subsequently, in a single lamination step assembling all the layers on posts to form an aligned stack, such that the windows are aligned in a common window region with an insulating layer positioned over the flex layer and extending only slightly beyond the window region and forming an anti-cracking support for the flex circuit layer, the step of assembling including assembling said layers with a curable layer extending only slightly into the window region over said insulating layer thereby forming a reinforcing band around edges of the window region, and curing the stack to rigidify areas of the stack outside the window into a unitary self-aligned assembly with the flex layer exposed in the window region.

6. The method of claim 5, wherein said rigid layers and said flex layer are each formed of glass epoxy material.

7. A method of forming a rigid flex circuit board, such method comprising the steps of providing at least one flex circuit layer and a plurality of other circuit layers in mutually registered sheets, the other circuit layers each having a mutually registered window defining a window region across which the at least one flex circuit layer is to extend adhering a dielectric material to said at least one flex circuit layer in a region covering said window region and extending only slightly outside of a region corresponding to the windows of the other circuit layers assembling said at least one flex and said other circuit layers together in an aligned stack with hardenable spacer/bonding material between said other layers, such that a first layer of the hardenable material encroaches only slightly into the window region over an edge of the dielectric material to form a reinforcing lip over said dielectric material, and curing the stack.

* * * * *